(12) United States Patent
Wilm et al.

(10) Patent No.: US 9,472,534 B2
(45) Date of Patent: Oct. 18, 2016

(54) METHOD OF ARRANGING A MULTIPLICITY OF LEDS IN PACKAGING UNITS, AND PACKAGING UNIT INCLUDING A MULTIPLICITY OF LEDS

(71) Applicant: OSRAM Opto Semiconductors GmcH, Regensburg (DE)

(72) Inventors: Alexander Wilm, Regensburg (DE); Roland Schulz, Regensburg (DE); Felix Michel, München (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 15/099,783

(22) Filed: Apr. 15, 2016

(65) Prior Publication Data

US 2016/0247789 A1     Aug. 25, 2016

Related U.S. Application Data

(62) Division of application No. 14/118,818, filed as application No. PCT/EP2012/059171 on May 16, 2012, now abandoned.

(30) Foreign Application Priority Data

May 31, 2011   (DE) .................. 10 2011 103 752

(51) Int. Cl.
*H01L 33/48*   (2010.01)
*H01L 25/075*  (2006.01)
*H01L 21/66*   (2006.01)

(52) U.S. Cl.
CPC ........... *H01L 25/0753* (2013.01); *H01L 22/26* (2013.01); *H01L 33/48* (2013.01); *H01L 2933/0033* (2013.01)

(58) Field of Classification Search
CPC ....... H01L 33/48; H01L 22/24; H01L 22/26; H01L 27/156
USPC .......................................................... 438/7
See application file for complete search history.

(56) References Cited

U.S. PATENT DOCUMENTS 6,900,471 B1     5/2005   Wicke et al.
2004/0227869 A1  11/2004  Martynov et al.
(Continued)

FOREIGN PATENT DOCUMENTS

DE   198 20 848 A1   11/1999
DE   100 37 420 A1   1/2002
(Continued)

OTHER PUBLICATIONS

English translation of corresponding Notification of Reasons for Refusal of JP Application No. 2014-513106 dated Dec. 1, 2014.
(Continued)

*Primary Examiner* — Tran Tran
(74) *Attorney, Agent, or Firm* — DLA Piper LLP (US)

(57) ABSTRACT

A method of arranging a multiplicity of LEDs in packaging units includes defining a desired range for at least one photometric measurement variable for each of the packaging units; selecting an LED from the multiplicity of LEDs not yet arranged in one of the packaging units; measuring the at least one photometric measurement variable for the selected LED; equipping one of the packaging units containing fewer than N−1 LEDs with the selected LED; storing a measured value and a position of the selected LED in the packaging unit in a memory; repeating until the packaging units are equipped with N−1 LEDs; repeating and calculating the average value of the photometric measurement variable, equipping a packaging unit for which the calculated average value of the variable lies in a defined range with the selected LED; and storing the measured value and the position of the selected LED.

9 Claims, 8 Drawing Sheets

(56) References Cited

U.S. PATENT DOCUMENTS

2006/0082987 A1    4/2006  Dorsey et al.
2011/0037080 A1    2/2011  Emerson et al.
2014/0160714 A1*  6/2014  Omura .................. H05K 13/04
                                                                     361/807

FOREIGN PATENT DOCUMENTS

| DE | 102 24 220 A1 | 12/2003 |
| --- | --- | --- |
| DE | 10 2010 049 857 A1 | 3/2012 |
| JP | 2008-147563 A | 6/2008 |
| JP | 2012-094709 A | 5/2012 |
| WO | 2008/110142 A1 | 9/2008 |

OTHER PUBLICATIONS

English translation of the Notification of First Office Action dated Oct. 8, 2015 from corresponding Chinese Application No. 201280027056.5.

* cited by examiner

METHOD OF ARRANGING A MULTIPLICITY OF LEDS IN PACKAGING UNITS, AND PACKAGING UNIT INCLUDING A MULTIPLICITY OF LEDS

RELATED APPLICATIONS

This is a divisional of U.S. application Ser. No. 14/118,818, filed Nov. 19, 2013, which is a §371 of International Application No. PCT/EP2012/059171, with an international filing date of May 16, 2012, which is based on German Patent Application No. 10 2011 103 752.0, filed May 31, 2011, the subject matter of which is incorporated herein.

TECHNICAL FIELD

This disclosure relates to a method of arranging LEDs in packaging units, and a packaging unit comprising a multiplicity of LEDs.

BACKGROUND

On account of their high efficiency, LEDs are increasingly being used in LED lamps for general lighting or in automobile headlights. It is often the case that a plurality of LED lamps are operated alongside one another, wherein the individual LED lamps can each contain a plurality of LEDs.

For different LED lamps arranged alongside one another offer a homogeneous appearance with regard to their brightness and/or their color, it is desirable for radiation emitted by the different LED lamps to have the same brightness and/or the same color locus in each case. However, during the manufacture of LEDs it cannot be ruled out that small brightness or color deviations of the individual LEDs occur, particularly in the case of LEDs from different production series. For this reason, the LED manufacturer often groups LEDs prior to delivery (so-called "binning"), wherein a group of LEDs (the so-called "bin") is distinguished, for example, by the fact that all the LEDs in this group have the same brightness and/or the same color locus. If only LEDs from a single group are used during production of LED lamps, it is ensured that all luminaires equipped with the LEDs have the same brightness and/or the same color locus. In this case, however, it is necessary for the customer of the LED manufacturer, which customer processes the individual LEDs further to form LED lamps, in each case to use only LEDs from the same LED group such that all the luminaires of different production series have the same brightness and/or the same color locus. Alternatively, it would also be conceivable for a luminaire manufacturer, in equipping an LED lamp, to select in a targeted manner a plurality of LEDs from different LED groups having different brightnesses and/or color loci such that the luminaire containing a plurality of LEDs has overall the desired values for the brightness and/or the color locus. This would have the advantage that the luminaire manufacturer could use LEDs from groups having different brightnesses and/or color loci, but on the other hand leads to an increased production outlay since LEDs from different packaging units would have to be used to equip an individual LED lamp.

It could therefore be helpful to provide a method of arranging LEDs in a packaging unit, which method achieves the effect that an LED component having a predetermined number of LEDs fulfils a desired value range for at least one photometric measurement variable, wherein the outlay to equip the LED component with LEDs from the packaging unit is low. Furthermore, it could be helpful to provide an advantageous packaging unit comprising a multiplicity of LEDs.

SUMMARY

We provide a method of arranging a multiplicity of LEDs in packaging units, including:
a) defining a desired value range for at least one photometric measurement variable for each of the packaging units, wherein an average value of the photometric measurement variable for a fixed number of $N \geq 3$ successive LEDs in the packaging units is intended to lie in the desired value range;
b) providing the multiplicity of LEDs and the packaging units;
c) selecting an LED from the multiplicity of LEDs which is not yet arranged in one of the packaging units;
d) measuring the at least one photometric measurement variable for the selected LED;
e) equipping one of the packaging units, containing fewer than $N-1$ LEDs with the selected LED, wherein the LEDs are strung together in the packaging unit in the equipping order;
f) storing a measured value of the at least one photometric measurement variable and a position of the selected LED in the packaging unit in a data memory;
g) repeating c) to f), until all of the packaging units are equipped with $N-1$ LEDs;
h) repeating c) and d) and calculating the average value of the at least one photometric measurement variable, which respectively results for the $N-1$ LEDs last arranged in the packaging unit and the selected LED, wherein the calculation is carried out for all of the packaging units;
i) equipping a packaging unit for which the calculated average value of the at least one photometric measurement variable lies in a defined desired value range with the selected LED, wherein the selected LED is arranged in the packaging unit such that it directly follows the LED last arranged in the packaging unit; or sorting out the selected LED if the calculated average value of the photometric measurement variable does not lie in the defined desired value range for any of the packaging units;
j) storing the measured value of the at least one photometric measurement variable and the position of the selected LED in the packaging unit in a data memory; and
k) repeating h) to j), until the packaging units are equipped with a desired total number of LEDs.

We also provide a packaging unit including a multiplicity of LEDs, wherein:
the LEDs are arranged in the packaging unit in an order;
an average value of at least one photometric measurement variable for a number of $N \geq 3$ successive LEDs removed at an arbitrary location of the packaging unit lies in a desired value range for the at least one photometric measurement variable;
the packaging unit is identified with the number N; and
the total number of the LEDs arranged in the packaging unit is greater than the number N at least by a factor of 20.

DETAILED DESCRIPTION

Figure 1:
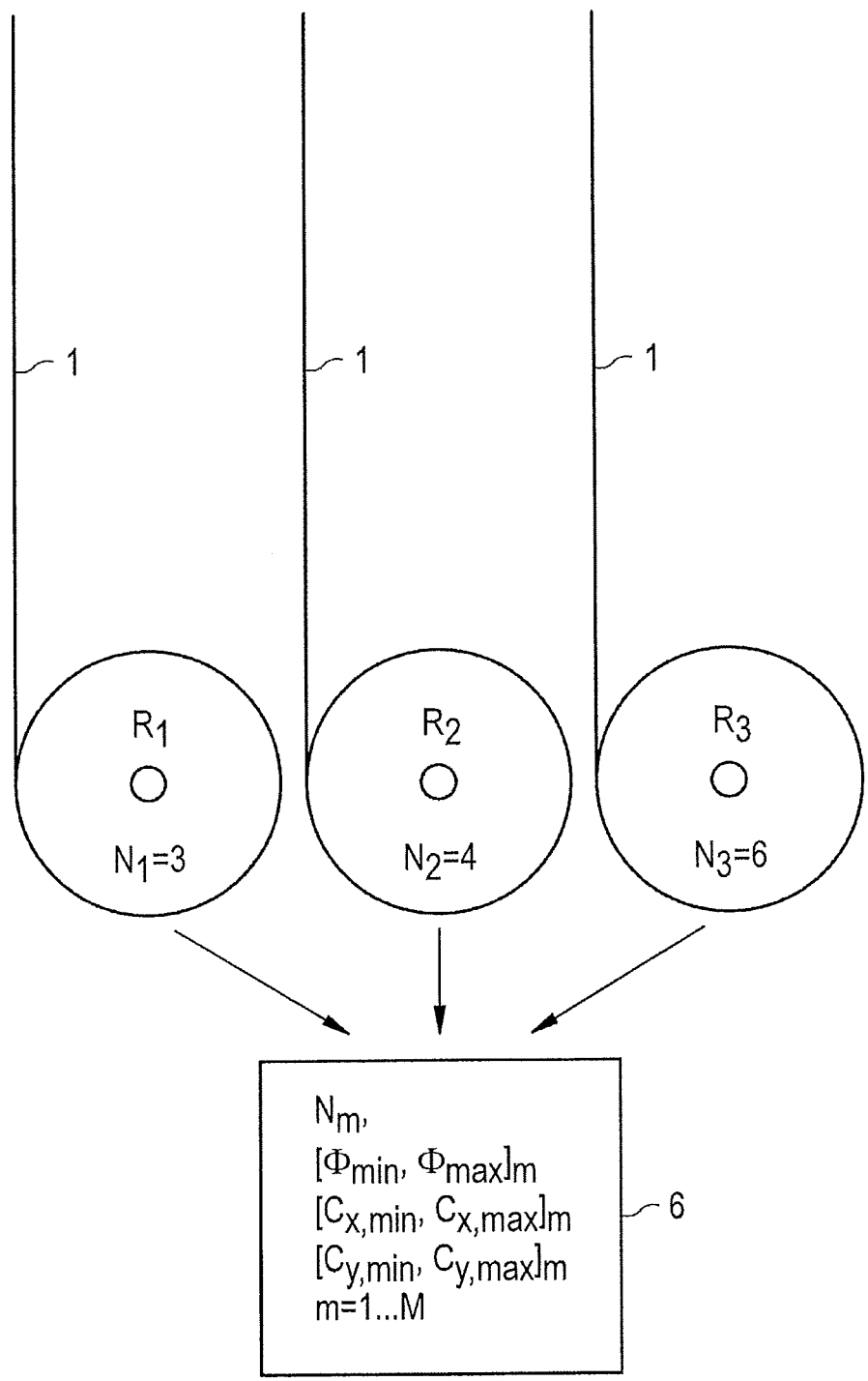
FIGS. 1 to 8 show an illustration of an example of our method of arranging a multiplicity of LEDs in packaging units on the basis of schematically illustrated intermediate steps.

We provide a method by which a multiplicity of LEDs are arranged in a plurality of packaging units.

Thus, a first step may involve defining a desired value range for at least one photometric measurement variable for each of the packaging units, wherein the average value of the photometric measurement variable for a fixed number of $N \geq 3$ successive LEDs in the packaging units is intended to lie in the desired value range.

In one configuration, the desired value range and the fixed number N of successive LEDs for which the average value of the photometric measurement variable is intended to lie in the desired value range are identical for the plurality of packaging units. By way of example, it can be provided that in each case four successive LEDs intended to be removed from one of the packaging units are intended to have an average value of the photometric measurement variable which is intended to lie in the desired value range. In this case, therefore, N=4 for all of the packaging units.

Alternatively, however, it is also possible for the plurality of packaging units to differ in terms of the desired value range and/or the fixed number N of successive LEDs for which the average value of the at least one photometric measurement variable lies in the desired value range. By way of example, it can be provided that three packaging units are equipped simultaneously, wherein the average value of the photometric measurement variable in the first packaging unit for $N_1=3$ successive LEDs is intended to lie in the desired value range. For the second packaging unit, the average value of the photometric measurement variable, for example, for $N_2=5$ successive LEDs is intended to lie in the desired value range, and for $N_3=7$ successive LEDs for the third packaging unit. The number N of successive LEDs in the packaging unit for which the average value of the photometric measurement variable is intended to lie in the desired value range is preferably defined according to the number of LEDs which the customer of the LED manufacturer removes from the packaging units for the purpose of equipping optoelectronic components. If, with the LEDs from a packaging unit, for example, optoelectronic components are in each case intended to be equipped with 5 LEDs, N=5 is defined for the packaging unit. In this case, the packaging unit is equipped by the method described below such that 5 successive LEDs removed from the packaging unit at an arbitrary location in the order of their arrangement respectively have an average value of the photometric measurement variable which lies in the predetermined desired value range.

In the method, the multiplicity of LEDs are provided, for example, in a supply container from which the LEDs can preferably be automatically removed individually. The multiplicity of LEDs can comprise, for example, more than 1000 or even more than 10000 LEDs. In particular, the multiplicity of LEDs can be a production series of LEDs of identical type which are intended to be arranged in packaging units prior to delivery to a customer of the LED manufacturer. Furthermore, the plurality of packaging units in which the LEDs are intended to be arranged are provided.

An LED which is not yet arranged in one of the packaging units may be selected from the multiplicity of LEDs. The selected LED is, for example, an arbitrary LED removed from the supply container.

Afterwards, the at least one photometric measurement variable is measured for the selected LED.

In a further step, one of the packaging units which still contains fewer than N−1 LEDs is equipped with the selected LED. The LEDs are strung together in the packaging units in each case in the equipping order. In other words, the LEDs are arranged sequentially in the packaging units, wherein the LED first arranged in the packaging unit is arranged at a first location, the LED arranged as second in the packaging unit is arranged at a second location, the LED arranged as third is arranged at a third location, and so on. The LEDs can therefore be removed again from the packaging unit in the order or the opposite order in which the packaging unit was equipped with the LEDs.

The measured value of the at least one photometric measurement variable and the position of the selected LED in the packaging unit are advantageously stored in a data memory.

The steps of selecting an LED, measuring the at least one photometric measurement variable of the selected LED, equipping one of the packaging units with the selected LED and storing the measured value and the position of the selected LED are subsequently repeated until all of the packaging units are equipped with N−1 LEDs.

Afterwards a further LED not yet arranged in one of the packaging units may be selected, and the at least one photometric measurement variable may be measured for the selected LED.

This is followed by calculating the average value of the at least one photometric measurement variable which respectively results for the N−1 LEDs last arranged in the packaging unit and the selected LED, wherein this calculation is preferably carried out for all of the packaging units. For this purpose, the measured values of the N−1 LEDs last arranged in the respective packaging unit are read out from the data memory. A check is made to determine whether, for at least one packaging unit, the number of N LEDs, which results from addition of the selected LED to the N−1 LEDs last arranged in the packaging unit, has an average value of the at least one photometric measurement variable that lies in the defined desired value range.

In a further step, a packaging unit is advantageously equipped with the selected LED for which the average value of the at least one photometric measurement variable calculated in this way lies in the previously defined desired value range. In this way, it is ensured that the N LEDs last arranged in the packaging unit have an average value of the photometric measurement variable which lies in the defined desired value range. In this method step, the selected LED is arranged in the packaging unit such that it directly follows the LED last arranged in the packaging unit. The LEDs are therefore strung together in the equipping order.

If the average value of the at least one photometric measurement variable for the N−1 LEDs last arranged in the packaging used and the selected LED does not lie in the previously defined desired value range for any of the packaging units, the selected LED cannot be assigned to any of the packaging units, and is sorted out. The LEDs sorted out are preferably stored in an intermediate store or fed to the supply container again since they can possibly be assigned to one of the packaging units in a later method step.

The measured value of the at least one photometric measurement variable and the position of the selected LED in the packaging unit are advantageously stored in the data memory.

The steps of selecting an LED, calculating the average value of the photometric measurement variable, equipping a packaging unit with the selected LED and storing the measured value and the position, or if appropriate sorting out the LED, are subsequently repeated until the packaging units are equipped with the desired total number of LEDs.

The packaging units are advantageously equipped with LEDs such that in each case a number of exactly N LEDs have an average value of the at least one photometric measurement variable which lies in the previously defined desired value range. Therefore, if exactly N successive LEDs are removed from the packaging unit, it is ensured that the average value of the photometric measurement variable for this number of N LEDs lies in the predetermined desired value range. When removing the LEDs from the packaging unit, it is not important from which location of the packaging unit the first LED of the sequence is removed. In particular, the average value of the at least one photometric measurement variable of a sequence of exactly N successive LEDs lies in the predetermined desired value range even when the LEDs are removed from the packaging unit in the opposite order to the equipping order. Furthermore, the average value of integer multiples of the number of N LEDs also lies in the desired value range. A packaging unit which is identified with the number N and is provided to equip components with N LEDs can therefore also be used to equip components with 2N LEDs, 3N LEDs and so on.

The fact that in each case exactly N successive LEDs, on account of the method described here for arrangement in the packaging unit, definitely have an average value of the photometric measurement variable in the desired value range does not, of course, rule out the fact that this can also be the case for a different number of LEDs in the packaging unit.

The method described herein to arrange LEDs in packaging units is advantageous particularly when the packaging units are provided to equip optoelectronic components each having a fixed number of N LEDs, wherein the N LEDs on average have to comply with a desired value for a photometric measurement variable. In particular, the arrangement of LEDs as described herein is advantageous in packaging units to equip components in which at least slight differences in the at least one photometric measurement variable of individual LEDs can be afforded tolerance if the average value of the N LEDs fulfils the desired value of the at least one photometric measurement variable. This is the case, for example, in optoelectronic components in which the plurality of LEDs, for example, on account of a light-diffusing cover, are not individually perceptible or are individually perceptible only with difficulty.

Advantageously, the at least one photometric measurement variable is the brightness of the LEDs. In this case, the LEDs are advantageously arranged in the packaging units such that a sequence of N successive LEDs in each case has on average a brightness which lies in the defined desired value range.

Further, the at least one photometric measurement variable may be the color locus of the LEDs. The color locus can be specified, in particular, by the coordinates $C_x$ and $C_y$ in the CIE chromaticity diagram. In this configuration, the average value of the color coordinates $C_x$, $C_y$ of N successive LEDs in the packaging units lies in each case in the defined desired value range. Consequently, this fixed number of N LEDs has the same color impression in each case.

It is possible for a plurality of photometric measurement variables to be used for the arrangement of the LEDs in the method. Particularly preferably, the photometric measurement variables are both the brightness and the color locus of the LEDs. In this configuration, therefore, the LEDs are arranged in the packaging units such that, for a predetermined number of N LEDs, both the average value of the brightness and the average values of the color coordinates lie in predetermined desired value ranges. In this way, it is ensured that a fixed number of N successive LEDs meet the requirements in respect of a predetermined brightness and a predetermined color locus.

As an alternative and/or in addition to the brightness and/or the locus, it is also possible to use another photometric measurement variable in the method to arrange the LEDs in the packaging units in a targeted manner. By way of example, the photometric measurement variable can be the color rendering index CRI or the wavelength $\lambda_{max}$ of the intensity maximum of the LED. Furthermore, it is also possible to use, in addition to the at least one photometric measurement variable, an electrical measurement variable to arrange the LEDs in the packaging unit. The electrical measurement variable can be, for example, the forward voltage $U_f$ of the LEDs.

In the method, the number of packaging units is preferably at least four. By way of example, four to ten packaging units can be equipped simultaneously.

The packaging units of the LEDs can be, in particular, rolls. The LEDs are preferably fixed on a tape on the roll such that they can easily be removed from the roll. The LEDs can be removed from the roll in a simple manner in the order in which the roll was equipped with the LEDs or in the opposite order with respect thereto.

Preferably, the packaging units are identified with the number N of successive LEDs for which the average value of the at least one photometric measurement variable lies in the desired value range. A customer of the LED manufacturer, which customer uses the packaging units for equipping optoelectronic components, can therefore infer from the packaging unit what number N of successive LEDs have an average value of the at least one photometric measurement variable which lies in the desired value range. To equip optoelectronic components each having a number of N LEDs, it is therefore possible to select a packaging unit identified with the value N.

Preferably, the packaging units are identified with the at least one photometric measurement variable and the associated desired value range.

The number N of LEDs for which the average value of the at least one photometric measurement variable lies in the desired value range is preferably 3 to 25, particularly preferably 3 to 15.

The total number of the LEDs arranged in the packaging units is advantageously significantly greater than the number N. Preferably, the total number of the LEDs arranged in the packaging units is greater than the number N at least by a factor of 20, a factor of 100 or even a factor of 500.

The total number of the LEDs arranged in the packaging units is advantageously at least 500 in each case. Preferably, the total number of the LEDs arranged in the packaging units is in each case at least 1000 or even at least 5000. By way of example, the packaging units can contain 500 to 20000 LEDs.

Furthermore, a packaging unit comprising a multiplicity of LEDs is specified in which the LEDs were arranged by the advantageous methods described herein.

Preferably, the packaging unit comprises a multiplicity of LEDs, wherein the LEDs are arranged in an order in the packaging unit. The average value of at least one photometric measurement variable for a number of N≥3 successive LEDs, removed at an arbitrary location of the packaging unit lies in a desired value range for the at least one photometric measurement variable, wherein the packaging unit is identified with the number N. The total number of the LEDs arranged in the packaging unit is advantageously greater than the number N at least by a factor of 20.

Further advantageous configurations of the packaging unit can be inferred from the description of the methods.

The methods of arranging a multiplicity of LEDs in packaging units and the packaging unit are explained in greater detail below on the basis of examples in association with FIGS. 1 to 9.

Identical or identically acting constituent parts are in each case provided with the same reference symbols in the figures. The illustrated constituent parts and also the size relationships of the constituent parts among one another should not be regarded as true to scale.

With the methods described herein, a multiplicity of LEDs, for example, a production series produced by an LED manufacturer, are packaged in packaging units to be delivered to a customer, for example.

As illustrated in FIG. 1, the packaging units can be rolls $R_1$, $R_2$, $R_3$, for example. The rolls each have a tape 1 on which the LEDs can be fixed. To simplify the illustration, the method is illustrated on the basis of an example comprising three packaging units $R_1$, $R_2$, $R_3$. In the methods, however, it is also possible to use more packaging units, preferably at least four packaging units being used.

In the methods, it is provided that, in each of the M packaging units, where M is the number of packaging units, a fixed number $N_m$ (m=1 to M) of successive LEDs have an average value of at least one photometric measurement variable which lies in a predetermined desired value range.

The number $N_m$ can be different for the packaging units which are equipped simultaneously. By way of example, in the case of the example illustrated in FIG. 1, a first packaging unit $R_1$, for which $N_1=3$ is defined, a second packaging unit $R_2$, for which $N_2=4$ is defined, and a third packaging unit $R_3$, for which $N_3=6$ is defined, are simultaneously equipped with LEDs. The number $N_m$ can therefore be determined separately for all of the packaging units m=1 to M. Alternatively, it would also be possible for $N_m$ to be identical for all of the packaging units.

Furthermore, a desired value range for at least one photometric measurement variable is defined for each of the packaging units $R_1$, $R_2$, $R_3$ which desired value range is intended to be fulfilled by the average value of the respective $N_m$ LEDs. The photometric measurement variable can be, in particular, the brightness $\Phi$. Advantageously, an interval $[\Phi_{min}, \Phi_{max}]_m$ for m=1 to M as desired value range is defined for each of the packaging units, where $\Phi_{min}$ is the permissible minimum brightness and $\Phi_{max}$ is the permissible maximum brightness. It is possible for the desired value range to be identical for all of the packaging units. Alternatively, however, it is also possible to define different desired value ranges for the packaging units.

Advantageously, one or a plurality of further photometric measurement variables may be used to arrange the LEDs in the packaging units. In addition or as an alternative to the brightness, in particular the color locus of the LEDs can be used as the photometric measurement variable. The color locus of an LED can be specified, for example, by the color coordinates $C_x$ and $C_y$ in the CIE chromaticity diagram. In the example described here, advantageously both the brightness $\Phi$ and the color coordinates $C_x$, $C_y$ are used as photometric measurement variables for the arrangement of the LEDs in the packaging units. In the same way as for the brightness $\Phi$, a desired value range $[C_{x,min}, C_{x,max}]_m$ and $[C_{y,min}, C_{y,max}]_m$ for m=1 to M is respectively defined for the color coordinates $C_x$ and $C_y$ as well. The desired value ranges for the color coordinates can be identical for all of the packaging units or have different values. The defined numbers $N_m$ and the desired value ranges are advantageously stored in a data memory 6.

Figure 2:
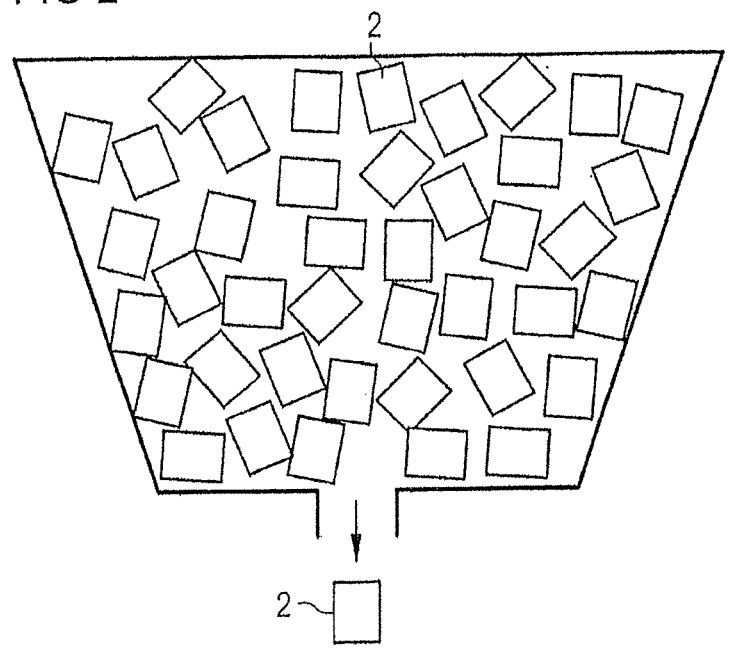

As illustrated in FIG. 2, the multiplicity of LEDs 2 intended to be arranged in packaging units are provided in a supply container 3, for example, from which the LEDs 2 can be individually removed. In the method, the LEDs 2 are successively removed from the supply container 3 and distributed among the plurality of packaging units.

Figure 3:
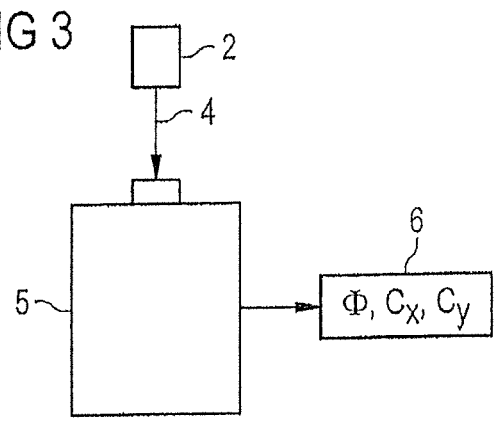

Afterwards, as illustrated schematically in FIG. 3, the at least one photometric measurement variable is measured for a selected LED 2. For this purpose, the radiation 4 emitted by the LED 2 is measured, for example, by a spectral photometer 5 and/or a photodiode. In the example described here, the brightness $\Phi$ and the color coordinates $C_x$, $C_y$ of the LED 2 are measured. Alternatively, however, it would also be possible for a different photometric measurement variable to be measured, for example, the wavelength $\lambda_{max}$ of the intensity maximum and/or the color rendering index (CRI). Furthermore, it is also possible for an electrical measurement variable of the LED 2, for example, the forward voltage $U_f$, to be measured in addition to the at least one photometric measurement variable. The measured value of the at least one photometric measurement variable is stored in a data memory. In the example illustrated here, therefore, the brightness $\Phi$ and the color coordinates $C_x$, $C_y$ for the selected LED 2 are stored in a data memory 6.

Figure 4:
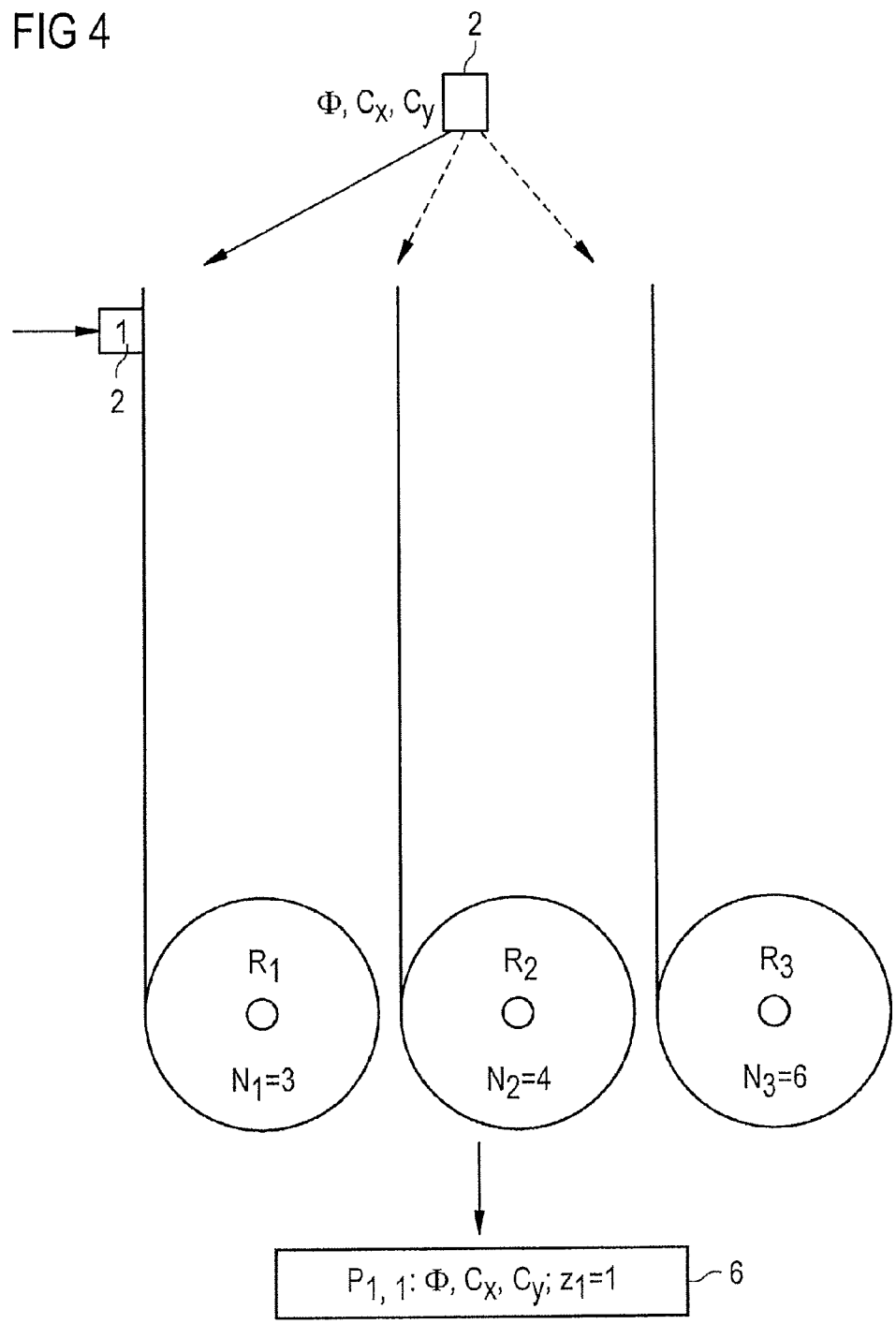

In a further method step illustrated schematically in FIG. 4, the selected LED 2 is assigned to one of the packaging units $R_1$, $R_2$, $R_3$. First, each of the packaging units is equipped with LEDs until the packaging units $R_1$, $R_2$, $R_3$ each comprise $N_m-1$ LEDs. That is to say that, first, the number of LEDs arranged in each of the packaging units is such that the packaging units each have one LED fewer than the previously defined number $N_m$ of successive LEDs which are intended to have, in the packaging unit, an average value of the at least one photometric measurement variable which lies in the defined desired value range. As illustrated in FIG. 4, the first selected LED 2 is arranged, for example, as first LED on the roll $R_1$.

After arrangement of the LED 2 at a first location of the roll $R_1$, the position of the LED 2 and the associated photometric measurement variables $\Phi$, $C_x$, $C_y$ are advantageously stored in the data memory 6. The position is noted as $P_{m,k}$, for example, where m indicates the number of the packaging unit and k indicates the number of the LED 2 in the packaging unit. The first LED of the first packaging unit therefore has the position $P_{1,1}$. Furthermore, the fact that a number of $z_1=1$ LEDs is now arranged in the packaging unit $R_1$ is stored in the data memory 6.

In the same way, further LEDs 2 are successively removed from the supply container, the photometric measurement variables are measured and the LEDs are assigned to the packaging units $R_1$, $R_2$, $R_3$. Until the number $N_m-1$ is reached in each of the packaging units $R_1$, $R_2$, $R_3$, the assignment of the respectively selected LED 2 to one of the packaging units does not have to be effected according to a fixed rule. Only the condition that for the time being none of the packaging units is equipped with more than $N_m-1$ LEDs has to continue to be fulfilled. Consequently, the packaging units $R_1$, $R_2$, $R_3$ can be equipped with LEDs up to this number of LEDs 2 in the packaging units, for example, successively or according to the random principle. It is also possible, however, for a selection in respect of which of the packaging units $R_1$, $R_2$, $R_3$ is assigned the respective selected LED 2 already to be effected on the basis of the measured photometric measurement variables.

Figure 5:
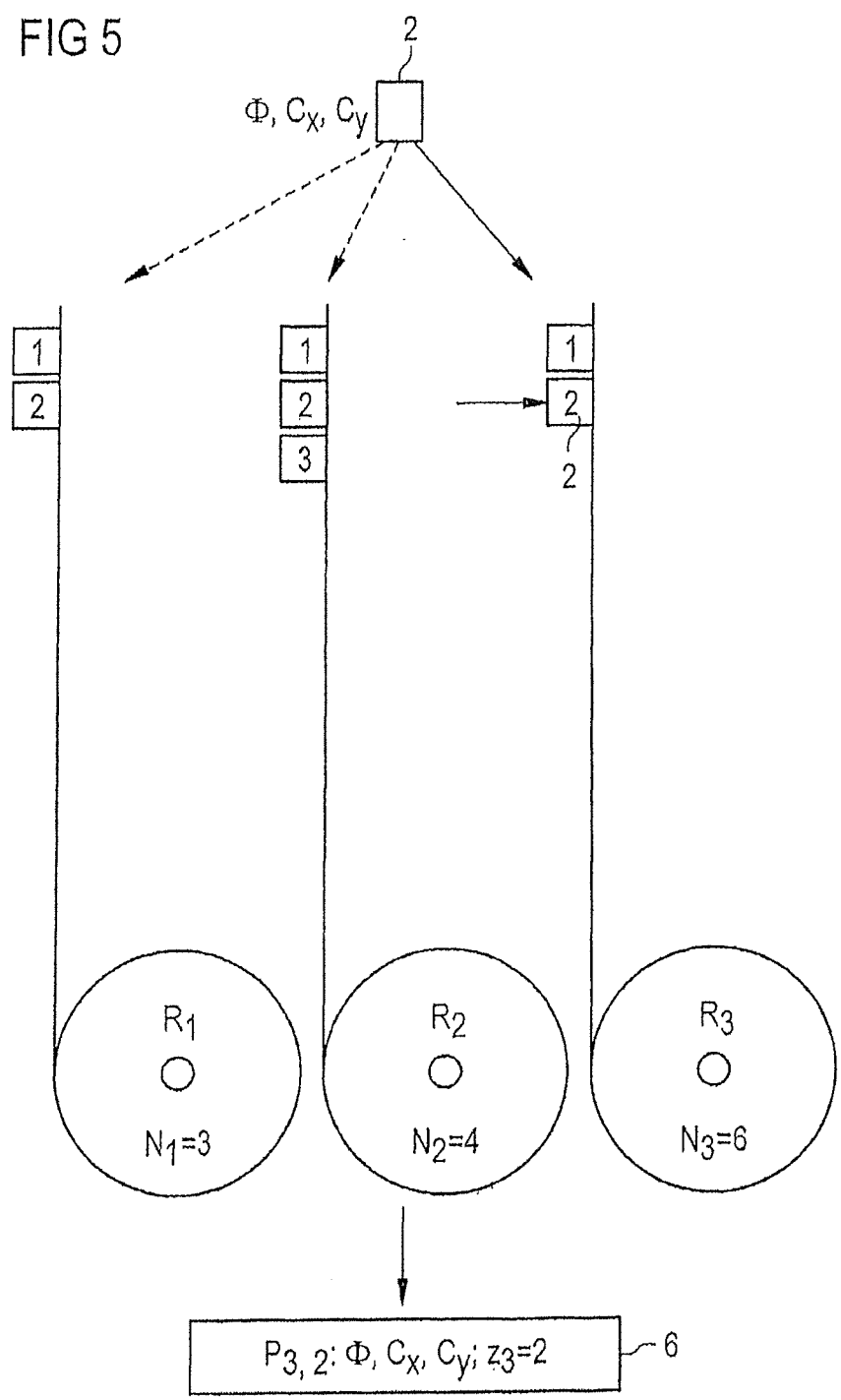

FIG. 5 schematically illustrates an intermediate step of the method in which the first packaging unit $R_1$ has already been equipped with two LEDs and the second packaging unit $R_2$ has been equipped with three LEDs. Since the value $N_1=3$ was defined for the first packaging unit $R_1$, the first packaging unit $R_1$ has already been equipped with $N_1-1=2$ LEDs. Since the value $N_2=4$ was defined for the second packaging unit $R_2$, the second packaging unit $R_2$, too, has already been equipped with $N_2-1=3$ LEDs. Consequently, the selected LED 2 is arranged in the third packaging unit $R_3$, which contains only one LED prior to being equipped with the additional LED 2, such that the number of LEDs in the third packaging unit $R_3$ is still less than $N_{3-1}=5$. After the arrangement of the selected LED 2 at the second location of the packaging unit $R_3$, the photometric measured values $\Phi$, $C_x$, $C_y$ of the LED 2 are assigned to the position $P_{3,2}$ of the LED 2 and these values and also the number $z_3=2$ of the LEDs in the third packaging unit $R_3$ are stored in the data memory 6.

Figure 6:
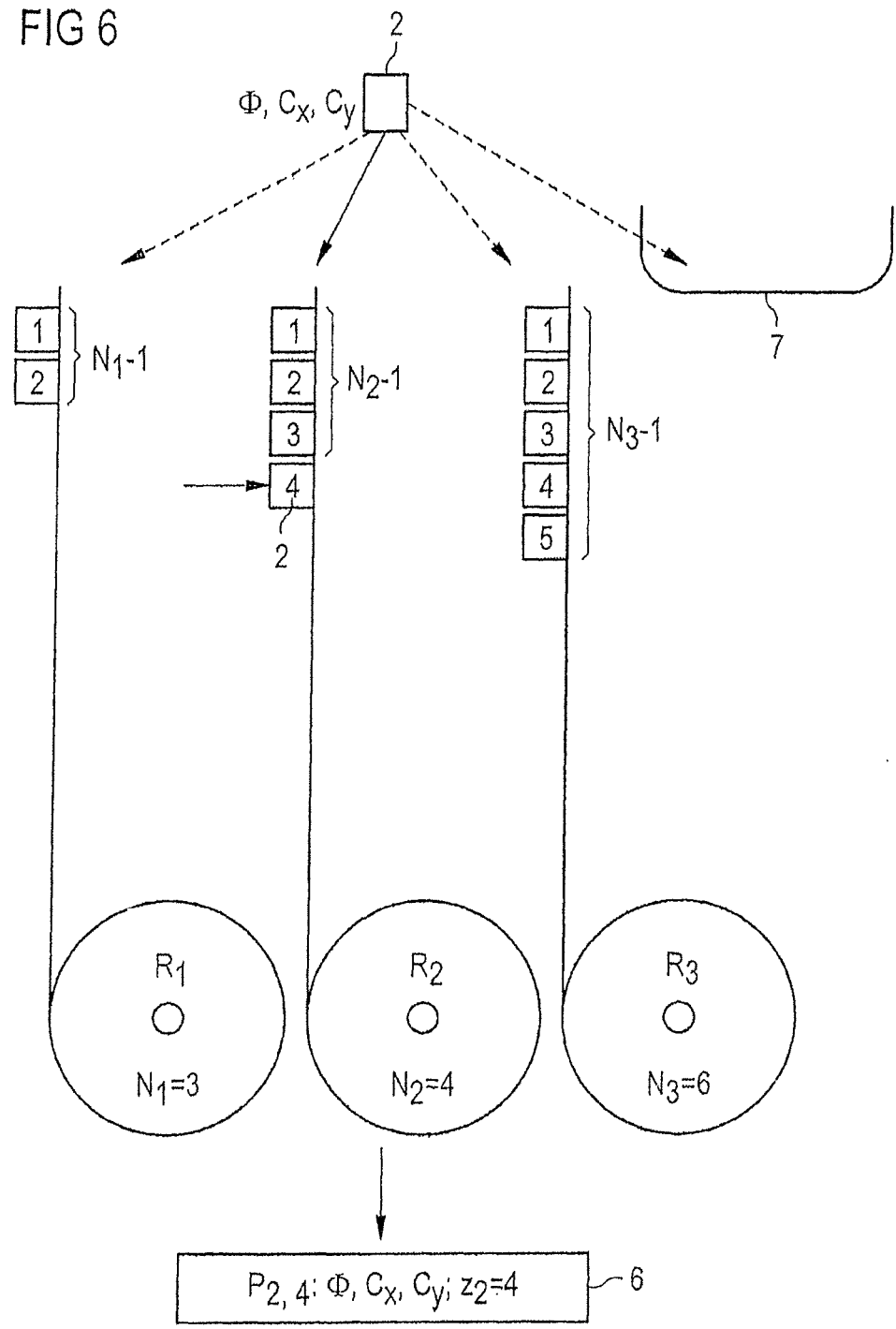

FIG. 6 illustrates an intermediate step of the method in which the packaging units $R_1$, $R_2$, $R_3$ have already been equipped respectively with $N_m-1$ LEDs. The assignment of a further selected LED 2, for which the brightness $\Phi$ and the color coordinates $C_x$, $C_y$ were measured, to one of the packaging units $R_1$, $R_2$, $R_3$ is then effected such that the average value of the photometric measurement variables which would result if the additional LED 2 were added to the $N_m-1$ LEDs already present is first calculated for all of the packaging units. The calculated average values of the photometric measurement variables are then compared to the desired value ranges previously defined for the packaging units. Therefore, for each packaging unit a check is made to determine whether the average value $$\Phi_{avg} = \frac{1}{N_m} \sum_{k=z_m-N_m+1}^{k=z_m+1} \Phi_k$$

lies in the desired value range $[\Phi_{min}, \Phi_{max}]_m$ defined for the packaging unit. In the same way, a check is made to determine whether the average values $$C_{x,avg} = \frac{1}{N_m} \sum_{k=z_m-N_m+1}^{k=z_m+1} C_{x,k} \text{ and } C_{y,avg} = \frac{1}{N_m} \sum_{k=z_m-N_m+1}^{k=z_m+1} C_{y,k}$$

lie in the previously defined desired value ranges $[C_{x,min}, C_{x,max}]_m$ and $[C_{y,min}, C_{y,max}]_m$.

If the calculated average values for one of the m=1 to M packaging units lie in the previously defined desired value ranges, the selected LED is arranged as the next LED in the packaging unit. In the example in FIG. 6, this is the case, for example, for the second packaging unit $R_2$ such that the selected LED 2 is arranged as the fourth LED in the second packaging unit $R_2$. The first four LEDs now arranged in the second packaging unit $R_2$ therefore fulfil the condition that the average values of the photometric measurement variables $\Phi_{avg}$, $C_{x,avg}$ and $C_{y,avg}$ lie in the desired value ranges defined for the packaging unit. After the LED 2 has been arranged as the fourth LED in the second packaging unit $R_2$, the position $P_{2,4}$ with the associated photometric measurement variables $\Phi$, $C_x$, $C_y$ and the updated number $z_2=4$ LEDs in the second packaging unit $R_2$ are stored in the data memory 6.

If, for the selected LED 2, the calculated average values of the photometric measurement variables do not lie in the previously defined desired value ranges for any of the packaging units $R_1$, $R_2$, $R_3$, the selected LED 2 can be stored in an intermediate store 7, for example, such that it can possibly be assigned to one of the packaging units $R_1$, $R_2$, $R_3$ at a later point in time. Furthermore, the case can also occur in which the calculated average values of the photometric measurement variables lie in the defined desired value ranges for a plurality of packaging units. In this case, therefore, it would be possible to assign the selected LED 2 to a plurality of packaging units. In this case, the assignment of the selected LED 2 to one of the suitable packaging units can be effected according to the random principle or according to a previously defined priority. By way of example, it can be defined beforehand that the selected LED 2 is in this case assigned to that packaging unit which still has the smallest number of LEDs.

Figure 7:
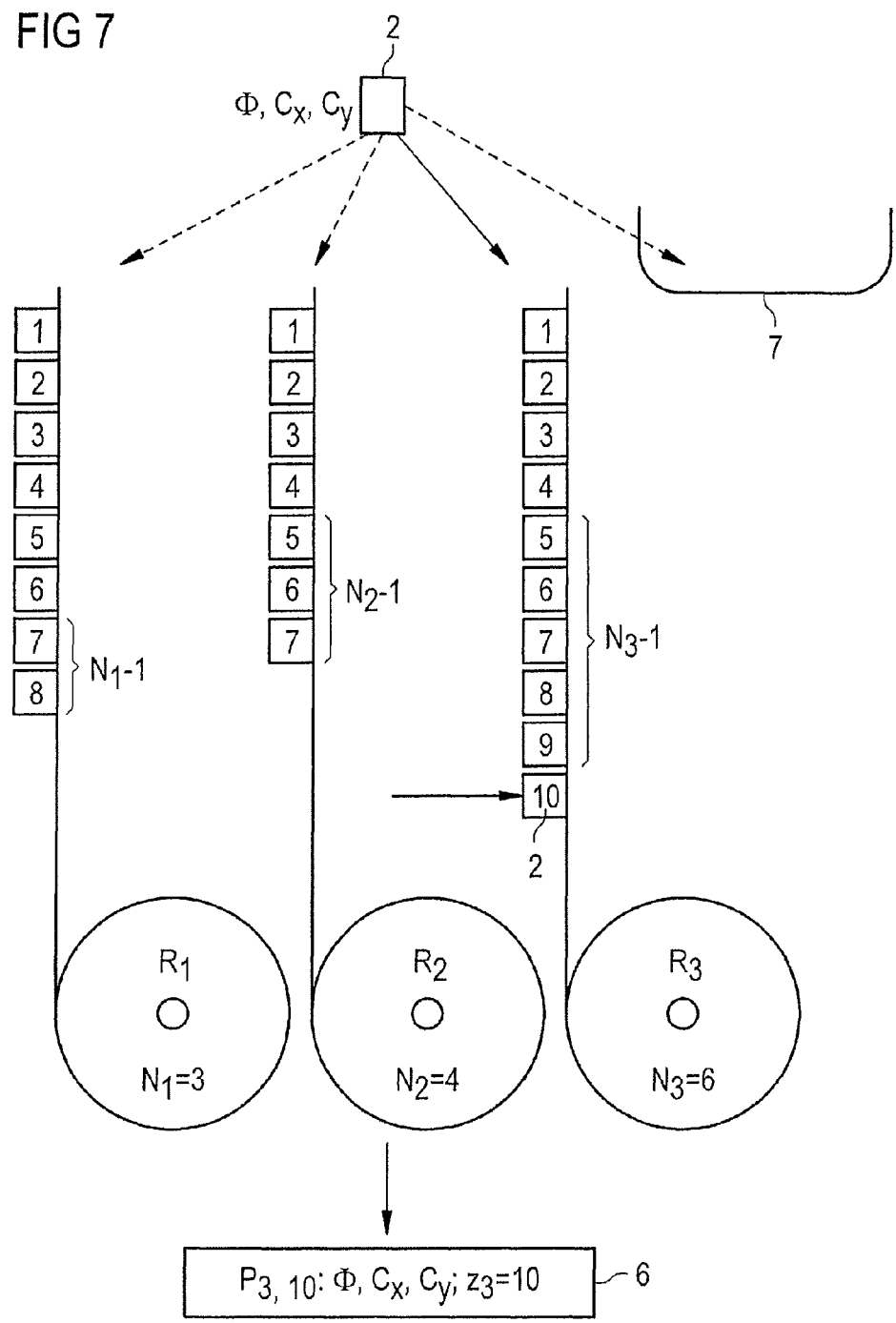

The LEDs 2 subsequently selected from the supply container are assigned to the packaging units $R_1$, $R_2$, $R_3$ in the same way, wherein in each case the $N_m-1$ LEDs last arranged in the respective packaging unit and the respectively selected LED 2 are used for the calculation of the average values of the photometric measurement variables. FIG. 7 illustrates, e.g., an intermediate step in which, prior to the addition of the selected LED 2, the first packaging unit $R_1$ has been equipped with eight LEDs, the second packaging unit $R_2$ has been equipped with seven LEDs and the third packaging unit $R_3$ has been equipped with nine LEDs. For the calculation of the average value of the photometric measurement variables, the two $N_1-1=2$ LEDs last added, that is to say the seventh and eighth LEDs, and the selected LED 2 are then used in the case of the first packaging unit. In the case of the second packaging unit, the $N_2-1=3$ LEDs last arranged in the packaging unit, that is to say the fifth, sixth and seventh LEDs, and the selected LED 2 are used for the calculation. In the case of the third packaging unit, the $N_3-1=5$ LEDs last arranged in the packaging unit, that is to say the fifth, sixth, seventh, eighth and ninth LEDs, and the selected LED 2 are used. During the calculation it emerges, for example, that the selected LED 2 in combination with the five LEDs last arranged in the third packaging unit $R_3$ has average values of the photometric measurement variables which lie in the previously defined desired value ranges. In this case, therefore the selected LED 2 is arranged at the tenth location in the third packaging unit $R_3$. Consequently, the position $P_{3,10}$, the associated photometric measurement variables $\Phi$, $C_x$, $C_y$ and the updated number of $z_3=10$ LEDs in the third packaging unit $R_3$ are stored in the data memory 6.

This type of assignment of the respectively selected LED 2 to one of the packaging units $R_1$, $R_2$, $R_3$ ensures that the average values of the photometric measurement variables for the previously defined number $N_m$ of successive LEDs definitely lie in the desired value ranges, to be precise independently of the location of the packaging units $R_1$, $R_2$, $R_3$ from which the $N_m$ successive LEDs are removed. In this case, it is also unimportant whether the $N_m$ successive LEDs are removed in the order in which they were arranged in the packaging unit, or in the opposite order.

Figure 8:
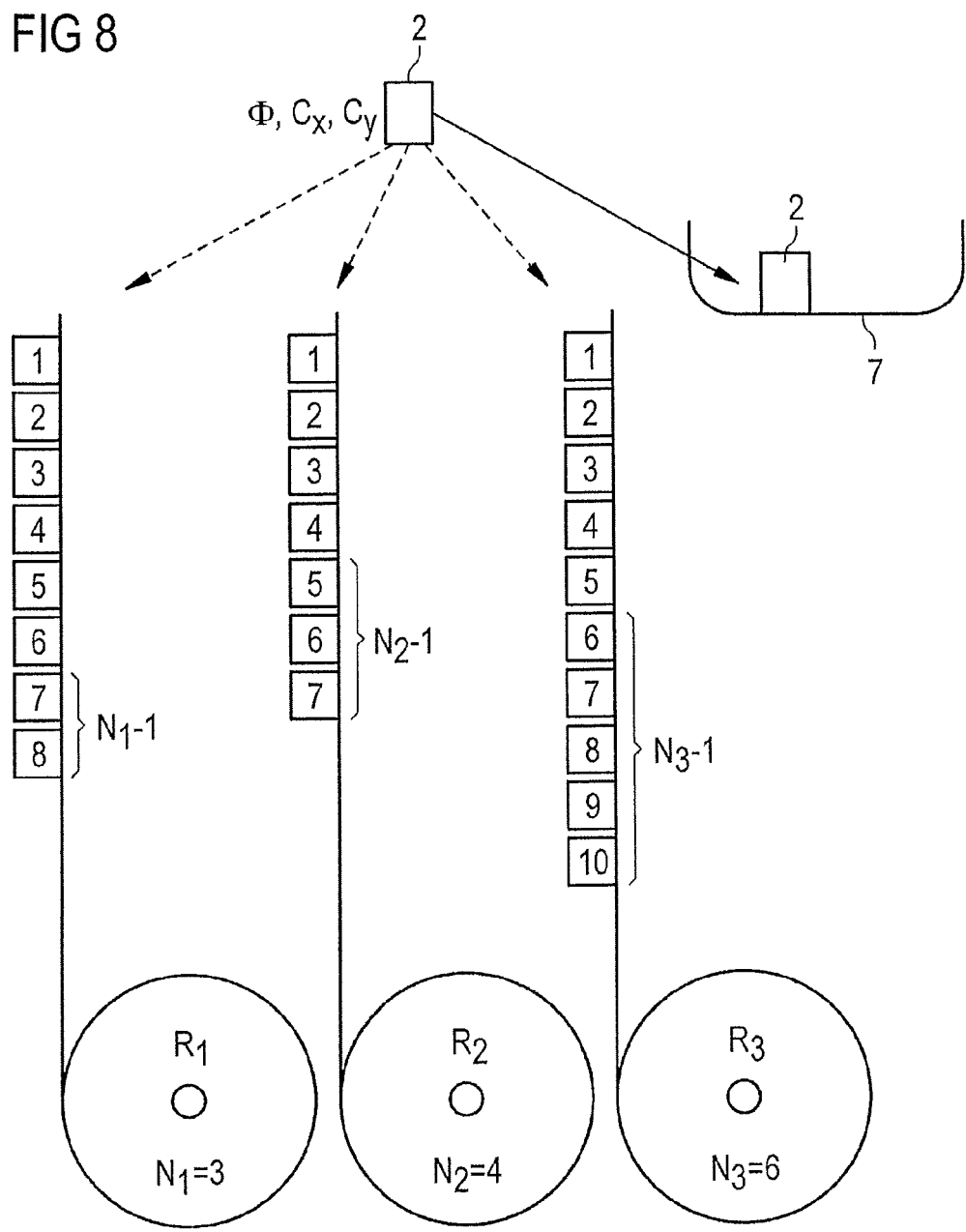

FIG. 8 illustrates an intermediate step in which, after the intermediate step carried out in FIG. 7, a further selected LED 2 is intended to be assigned to one of the packaging units $R_1$, $R_2$, $R_3$. In this case, it emerges, for example, that the condition that the $N_m-1$ LEDs last arranged in the respective packaging unit in combination with the additional selected LED 2 yield average values of the photometric measurement variables which lie in the previously defined desired value ranges is not fulfilled for any of the packaging units $R_1, R_2, R_3$. In this case, therefore, the selected LED 2 is not assigned to any of the packaging units, but rather is stored in the intermediate store 7. Alternatively, it would also be possible to place the LED 2 again into the supply container from which it was removed. The LED 2 stored in the intermediate store 7 or the supply container can be assigned to one of the packaging units at a later point in time.

Figure 9:
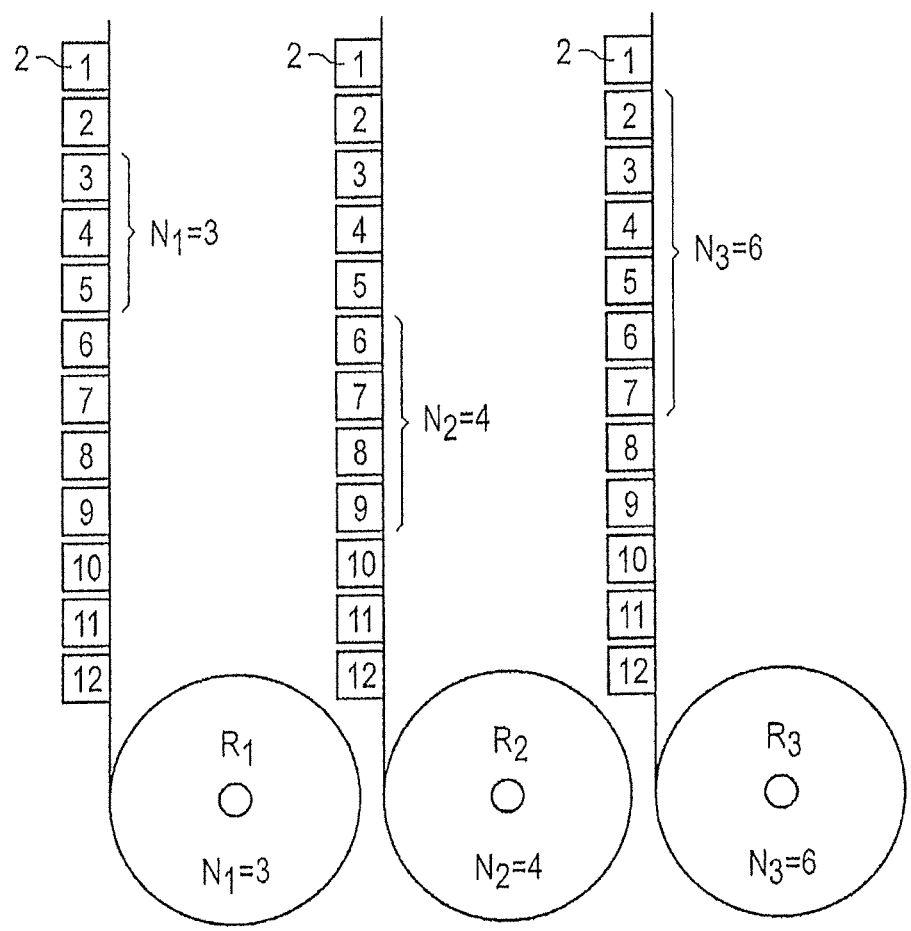
FIG. 9 shows a schematic illustration of packaging units each comprising a multiplicity of LEDs.

The method described above is continued until all of the packaging units $R_1, R_2, R_3$ are equipped with the desired number of LEDs. FIG. 9 illustrates the three packaging units $R_1, R_2, R_3$, for example, after they were each equipped with a multiplicity of LEDs 2. To simplify the illustration, only twelve LEDs 2 in each case are illustrated for each packaging unit. In actual fact, the preferred number of LEDs 2 arranged in the packaging units $R_1, R_2, R_3$ is in each case at least 500, at least 1000 or even at least 5000 LEDs. Typically, for example, approximately 500 to 20000 LEDs 2 are arranged on a roll functioning as a packaging unit $R_1, R_2, R_3$.

In one configuration of the packaging units $R_1, R_2, R_3$, the total number of the LEDs 2 arranged in the packaging units is greater at least by a factor of 20 than the number $N_m$ of successive LEDs, for which the average value of the photometric measurement variables lies in the desired value range. Particularly preferably, the total number of the LEDs 2 arranged in the packaging units $R_1, R_2, R_3$ is greater than the number $N_m$ by at least a factor of 100 or even by at least a factor of 500. The number $N_m$ of successive LEDs 2 which fulfil the abovementioned conditions for the average value of the at least one photometric measurement variable is preferably 3 to 25. The packaging units $R_1, R_2, R_3$ are preferably in each case identified with the number $N_m$. Particularly preferably, the packaging units $R_1, R_2, R_3$ are also identified with the at least one photometric measurement variable, for example, the brightness $\Phi$ and the color locus $C_x$, $C_y$, and the associated desired value ranges.

$N_m$ LEDs can be removed from the fully equipped packaging units $R_1, R_2, R_3$ from an arbitrary location, wherein the average values of the brightness $\Phi$ and of the color loci $C_x$, $C_y$ for this number of LEDs definitely lie in the desired value ranges. By way of example, as indicated in FIG. 8, the third to fifth LEDs could be removed from the first packaging unit $R_1$, the sixth to ninth LEDs could be removed from the second packaging unit $R_2$ or the second to sixth LEDs could be removed from the third packaging unit.

Our methods and packaging units are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of arranging a multiplicity of LEDs in packaging units comprising:
    a) defining a desired value range for at least one photometric measurement variable for each of the packaging units, wherein an average value of the photometric measurement variable for a fixed number of $N \geq 3$ successive LEDs in the packaging units is intended to lie in the desired value range;
    b) providing the multiplicity of LEDs and the packaging units;
    c) selecting an LED from the multiplicity of LEDs which is not yet arranged in one of the packaging units;
    d) measuring the at least one photometric measurement variable for the selected LED;
    e) equipping one of the packaging units, containing fewer than N−1 LEDs with the selected LED, wherein the LEDs are strung together in the packaging unit in the equipping order;
    f) storing a measured value of the at least one photometric measurement variable and a position of the selected LED in the packaging unit in a data memory;
    g) repeating c) to f), until all of the packaging units are equipped with N−1 LEDs;
    h) repeating c) and d) and calculating the average value of the at least one photometric measurement variable, which respectively results for the N−1 LEDs last arranged in the packaging unit and the selected LED, wherein the calculation is carried out for all of the packaging units;
    i) equipping a packaging unit for which the calculated average value of the at least one photometric measurement variable lies in a defined desired value range with the selected LED, wherein the selected LED is arranged in the packaging unit such that it directly follows the LED last arranged in the packaging unit; or sorting out the selected LED if the calculated average value of the photometric measurement variable does not lie in the defined desired value range for any of the packaging units;
    j) storing the measured value of the at least one photometric measurement variable and the position of the selected LED in the packaging unit in a data memory; and
    k) repeating h) to j), until the packaging units are equipped with a desired total number of LEDs.

2. The method according to claim 1, wherein the at least one photometric measurement variable is brightness and/or locus.

3. The method according to claim 1, wherein the number of packaging units is at least 4.

4. The method according to claim 1, wherein the packaging units are rolls.

5. The method according to claim 1, wherein the packaging units are identified with the number N of successive LEDs for which the average value of the at least one photometric measurement variable lies in the desired value range.

6. The method according to claim 1, wherein the packaging units are identified with the at least one photometric measurement variable and the desired value range.

7. The method according to claim 1, wherein the number N is 3 to 25.

8. The method according to claim 1, wherein the total number of the LEDs arranged in the packaging units is greater than the number N at least by a factor of 20.

9. The method according to claim 1, wherein the total number of the LEDs arranged in the packaging units is at least 500.

* * * * *